(12) United States Patent
Lidow et al.

(10) Patent No.: US 8,404,508 B2
(45) Date of Patent: Mar. 26, 2013

(54) ENHANCEMENT MODE GAN HEMT DEVICE AND METHOD FOR FABRICATING THE SAME

(75) Inventors: Alexander Lidow, Marina Del Ray, CA (US); Robert Beach, La Crescenta, CA (US); Alana Nakata, Redondo Beach, CA (US); Jianjun Cao, Torrance, CA (US); Guang Yuan Zhao, Torrance, CA (US)

(73) Assignee: Efficient Power Conversion Corporation, El Segundo, CA (US)

( * ) Notice: Subject to any disclaimer, the term of this patent is extended or adjusted under 35 U.S.C. 154(b) by 495 days.

(21) Appl. No.: 12/756,960

(22) Filed: Apr. 8, 2010

(65) Prior Publication Data

US 2010/0258843 A1    Oct. 14, 2010

Related U.S. Application Data

(60) Provisional application No. 61/167,777, filed on Apr. 8, 2009.

(51) Int. Cl.
*H01L 21/00* (2006.01)

(52) U.S. Cl. ... 438/46; 438/172; 438/285; 257/E21.409; 257/E29.091; 257/E29.194; 257/E29.252; 257/E29.315

(58) Field of Classification Search ............... 438/46–52, 438/172–177, 285–299, 481; 257/E21.409, 257/E29.074, 89, 91, 194, 242, 246, 252, 257/315

See application file for complete search history.

(56) References Cited

U.S. PATENT DOCUMENTS

| | | | |
|---|---|---|---|
| 5,474,946 A | 12/1995 | Ajit et al. | |
| 6,001,716 A | 12/1999 | Liao | |
| 6,537,838 B2 | 3/2003 | Stockman | |
| 6,833,161 B2 | 12/2004 | Wang et al. | |
| 7,470,941 B2 | 12/2008 | Micovic et al. | |
| 7,544,963 B2 * | 6/2009 | Saxler | 257/20 |
| 7,932,539 B2 * | 4/2011 | Chen et al. | 257/194 |
| 2005/0277218 A1 * | 12/2005 | Nakajo et al. | 438/46 |
| 2006/0192218 A1 | 8/2006 | Kyono et al. | |
| 2006/0273347 A1 | 12/2006 | Hikita et al. | |
| 2007/0254418 A1 | 11/2007 | Sheppard et al. | |
| 2008/0116492 A1 | 5/2008 | Wu et al. | |
| 2009/0045438 A1 * | 2/2009 | Inoue et al. | 257/192 |
| 2009/0072272 A1 * | 3/2009 | Suh et al. | 257/194 |
| 2009/0289330 A1 * | 11/2009 | Shibata | 257/615 |
| 2009/0318698 A1 * | 12/2009 | Hartmann et al. | 546/4 |
| 2010/0171150 A1 * | 7/2010 | Smith et al. | 257/194 |

(Continued)

OTHER PUBLICATIONS

Hu, et al. "Enhancement Mode AlGaN/GaN HFET With Selectively Grown pn Junction Gate", *Electronics Letters*, vol. 35, No. 8, pp. 753-754, Apr. 13, 2000.

(Continued)

*Primary Examiner* — Michael Lebentritt
(74) *Attorney, Agent, or Firm* — Dickstein Shapiro LLP

(57) ABSTRACT

An enhancement-mode GaN transistor and a method of forming it. The enhancement-mode GaN transistor includes a substrate, transition layers, a buffer layer comprised of a III Nitride material, a barrier layer comprised of a III Nitride material, drain and source contacts, a gate III-V compound containing acceptor type dopant elements, and a gate metal, where the gate III-V compound and the gate metal are formed with a single photo mask process to be self-aligned and the bottom of the gate metal and the top of the gate compound have the same dimension. The enhancement mode GaN transistor may also have a field plate made of Ohmic metal, where a drain Ohmic metal, a source Ohmic metal, and the field plate are formed by a single photo mask process.

5 Claims, 25 Drawing Sheets

U.S. PATENT DOCUMENTS

2011/0272665 A1* 11/2011 Yamaguchi et al. ............ 257/12
2011/0278644 A1* 11/2011 Gao et al. ..................... 257/190
2012/0076968 A1* 3/2012 Dmitriev et al. ............. 428/64.1
2012/0175631 A1* 7/2012 Lidow et al. ..................... 257/76

OTHER PUBLICATIONS

T. Fuji et al. " High On/Off Ratio in Enhancement-Mode $Al_xGax_{1-N}$/GaN Junction Heterostructure Field-Effect Transistors with P-Type GaN Gate Contact", *Japanese Journal of Applied Physics*, vol. 45, No. 39, pp. L1048-L1050, 2006.

Y. Uemoto et al. Gate Injection Transistor (GIT)—A Normally-Off AlGaN/GaN Power Transistor Using Conductivity Modulation, *IEEE Transactions on Electron Devices*, vol. 54, No. 12, pp. 3393-3399, Dec. 2007.

W. Saito, et al. "High Breakdown Voltage AlGaN-GaN Power-HEMT Design and High Current Density Switching Behavior", *IEEE Transactions on Electron Devices*, vol. 50, No. 12, pp. 2528-2531, Dec. 2003.

* cited by examiner

ENHANCEMENT MODE GAN HEMT DEVICE AND METHOD FOR FABRICATING THE SAME

CROSS REFERENCE TO RELATED APPLICATIONS

This application claims priority from U.S. Provisional Application No. 61/167,777, filed on Apr. 8, 2009, which is hereby incorporated by reference in its entirety.

FIELD OF THE INVENTION

The present invention relates to the field of enhancement mode gallium nitride (GaN) high electron mobility transistor (HEMT) devices. In particular, the invention relates to a method and apparatus for providing an enhancement type HEMT device.

BACKGROUND OF THE INVENTION

Gallium nitride (GaN) semiconductor devices are increasingly desirable for power semiconductor devices because of their ability to carry large current and support high voltages. Development of these devices has generally been aimed at high power/high frequency applications. Devices fabricated for these types of applications are based on general device structures that exhibit high electron mobility and are referred to variously as heterojunction field effect transistors (HFET), high electron mobility transistors (HEMT), or modulation doped field effect transistors (MODFET).

A GaN HEMT device includes a nitride semiconductor with at least two nitride layers. Different materials formed on the semiconductor or on a buffer layer cause the layers to have different band gaps. The different material in the adjacent nitride layers also causes polarization, which contributes to a conductive two dimensional electron gas (2DEG) region near the junction of the two layers, specifically in the layer with the narrower band gap.

The nitride layers that cause polarization typically include a barrier layer of AlGaN adjacent to a layer of GaN to include the 2DEG, which allows charge to flow through the device. This barrier layer may be doped or undoped. Because the 2DEG region exists under the gate at zero gate bias, most nitride devices are normally on, or depletion mode devices. If the 2DEG region is depleted, i.e. removed, below the gate at zero applied gate bias, the device can be an enhancement mode device. Enhancement mode devices are normally off and are desirable because of the added safety they provide and because they are easier to control with simple, low cost drive circuits. An enhancement mode device requires a positive bias applied at the gate in order to conduct current.

In conventional enhancement mode GaN transistors, the gate metal and the p-type GaN material or p-type AlGaN material are defined by using separate photo masks. For example, FIG. 1 (prior art) shows the gate metal and gate pGaN were processed with two different photo masks. FIG. 1 illustrates a conventional enhancement mode GaN transistor device 100 which includes substrate 101 which can be either sapphire or silicon, transition layers 102, un-doped GaN material 103, un-doped AlGaN material 104, source ohmic contact metal 109, drain ohmic contact metal 110, p-type AlGaN or p-type GaN material 105, heavily doped p-type GaN material 106, and gate metal 111.

As shown in FIG. 1, the gate metal, p-type GaN, or p-type AlGaN material are defined by two separate photo masks. The first mask is used to form the p-type GaN or p-type AlGaN, either by patterning a hard mask and selectively growing the p-type GaN or by patterning and etching the p-type GaN. The second mask is used to form the gate metal either by patterning and lifting off the gate metal or by patterning and etching the gate metal. The two mask process leads to wider gate length than photo/etch minimum CD. This causes high gate charge, wider cell pitch, and higher Rdson ("on resistance"). The conventional method of fabrication also increases manufacturing costs. Another disadvantage is that the highest electric field is located at the p-type GaN material or p-type AlGaN material gate corner toward the drain ohmic contact metal. This high electric field leads to high gate leakage current and a gate reliability risk.

It would be desirable to provide an enhancement mode GaN transistor structure with a self-aligned gate which avoids the above-mentioned disadvantages of the prior art. It would also be desirable to provide a feature to relieve the high electric field at the gate corner of the p-type GaN or AlGaN.

DETAILED DESCRIPTION OF THE PREFERRED EMBODIMENTS

In the following detailed description, reference is made to certain embodiments. These embodiments are described with sufficient detail to enable those skilled in the art to practice them. It is to be understood that other embodiments may be employed and that various structural, logical, and electrical changes may be made.

The present invention is an enhancement mode GaN HEMT device with a gate metal material and a doped GaN or AlGaN material that are self-aligned, and a method for making such a device. The materials are patterned and etched using a single photo mask, which reduces manufacturing costs. Furthermore, a field plate at source potential is patterned and etched together with drain and source ohmic contact metal. The field plate reduces the electric field at the gate corner of this enhancement mode GaN HEMT device.

Figure 1:
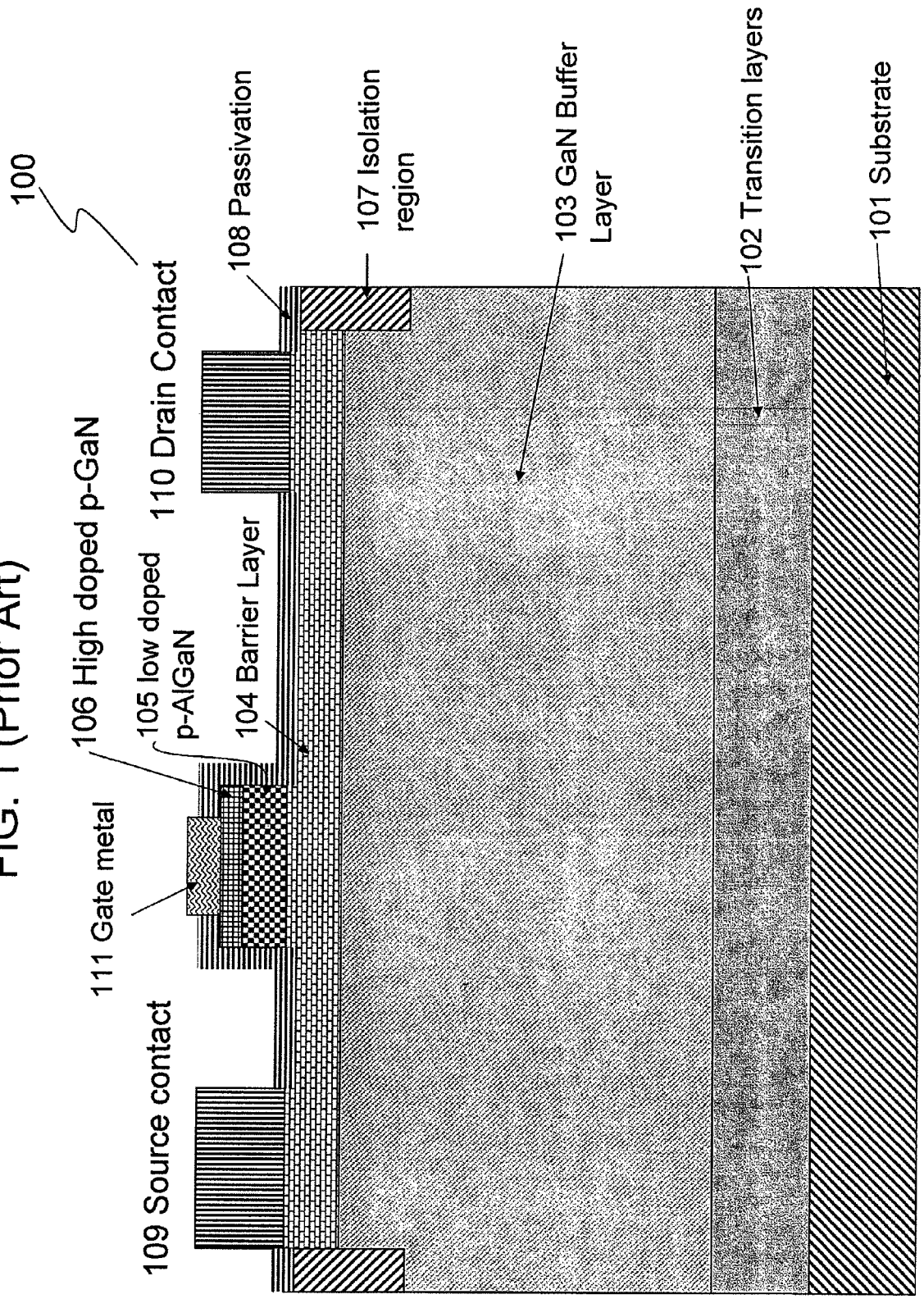
FIG. 1 illustrates a cross-sectional view of a conventional enhancement mode GaN transistor.
Figure 2:
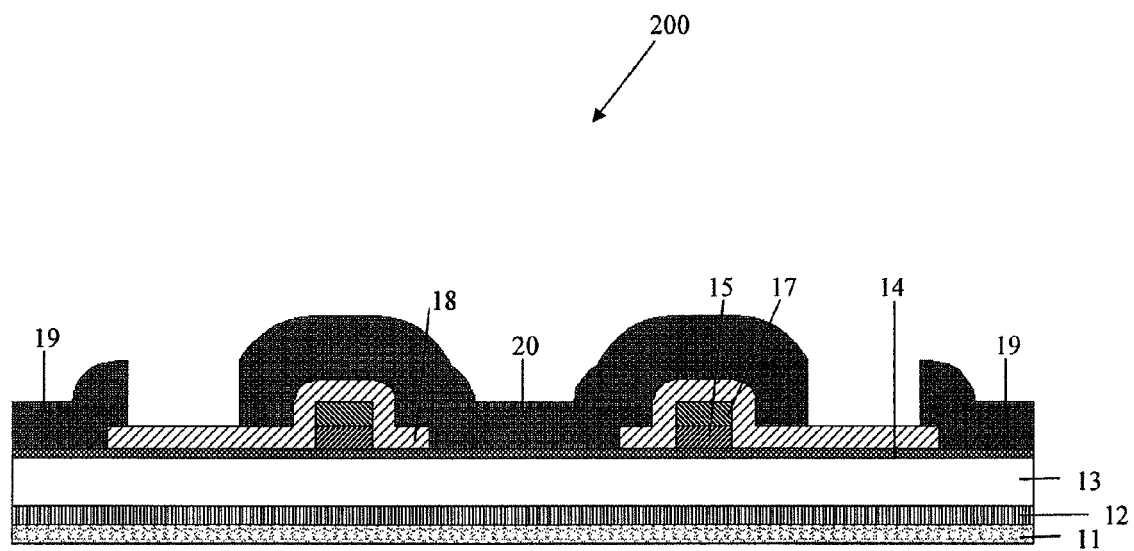
FIG. 2 illustrates an enhancement mode GaN HEMT device formed according to a first embodiment of the present invention described herein.

Referring to FIGS. 2 and 3A-3E, a first embodiment is now described for forming an enhancement mode GaN HEMT device with a self-aligned gate, wherein like reference numbers are used consistently for like features throughout the drawings. FIG. 2 illustrates an enhancement mode GaN HEMT device 200 formed by the method described below with respect to FIGS. 3A-3E, which has a gate metal 17 and a p-type GaN material 15 that are self-aligned. Device 200 includes a silicon substrate 11, transition layers 12, un-doped GaN buffer material 13, un-doped AlGaN barrier material 14, p-type GaN gate layer 15, gate metal 17, dielectric material 18, drain ohmic contact 19, and source ohmic contact 20. The source metal 20 also serves as a field plate that extends over the gate and toward the drain contact. Layers 13, 14, and 15 are made of a III Nitride material. A III Nitride material can be composed of $In_xAl_yGa_{1-x-y}N$, where $x+y \leq 1$.

Figure 3A:
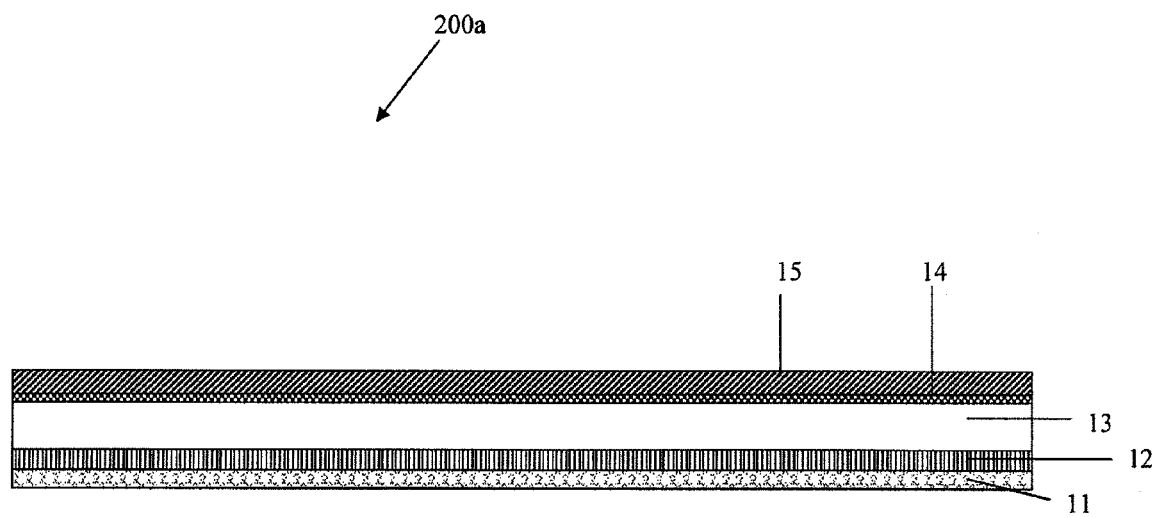
FIGS. 3A-3E schematically illustrate the formation of an enhancement mode GaN HEMT device according to the first embodiment of the present invention.

FIG. 3A illustrates the EPI structure of GaN HEMT device 200a, including, from bottom up, silicon substrate 11, transition layers 12, un-doped GaN buffer material 13, un-doped AlGaN barrier layer 14, and p-type GaN gate layer 15. The un-doped GaN buffer material 13 preferably has a thickness of about 0.5 to about 5 μm. The un-doped AlGaN barrier layer 14 preferably has a thickness of about 50 Å to about 300 Å. The un-doped AlGaN barrier layer 14 includes Al from about 12 to 100 percent of the metallic content of the AlGaN material. The p-type GaN gate layer 15 may have a thickness of about 100 Å to about 2000 Å. Additionally, the p-type GaN gate layer may have a doping concentration between about $10^{18}$ to about $10^{21}$ atoms per $cm^3$.

Figure 3B:
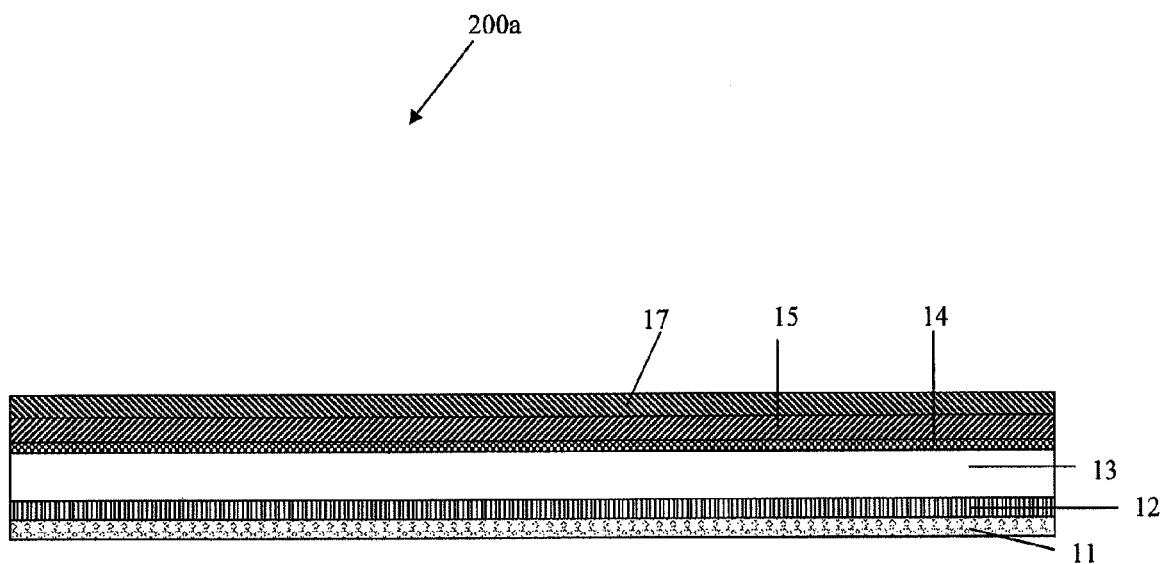

As shown in FIG. 3B, a gate metal 17 is deposited on the EPI structure shown in FIG. 3A. The gate metal 17, alternatively, can be grown at the end of EPI growth. Gate metal 17 can be made of a refractory metal or its compound, e.g., tantalum (Ta), tantalum nitride (TaN), titanium nitride (TiN), palladium (Pd), tungsten (W), tungsten silicide ($WSi_2$).

Subsequently, a single photo mask is used to pattern and etch the gate metal 17 and the p-type GaN gate layer 15, resulting in the structure shown in FIG. 3C. The gate metal 17 and the p-type GaN gate layer 15 are etched by any known technique, e.g., plasma etching, followed by a photoresist strip. The p-type GaN gate layer 15 can be under-etched, leaving about 0 to about 10 nm of the gate material outside of the gate region. The gate layer 15 can also be over-etched, removing about 0 to about 3 nm of the barrier layer 14 outside of the gate region. In the over-etching case, the barrier layer 14 is about 0 to about 3 nm thinner outside of the gate region than that in the gate region.

Figure 3C:
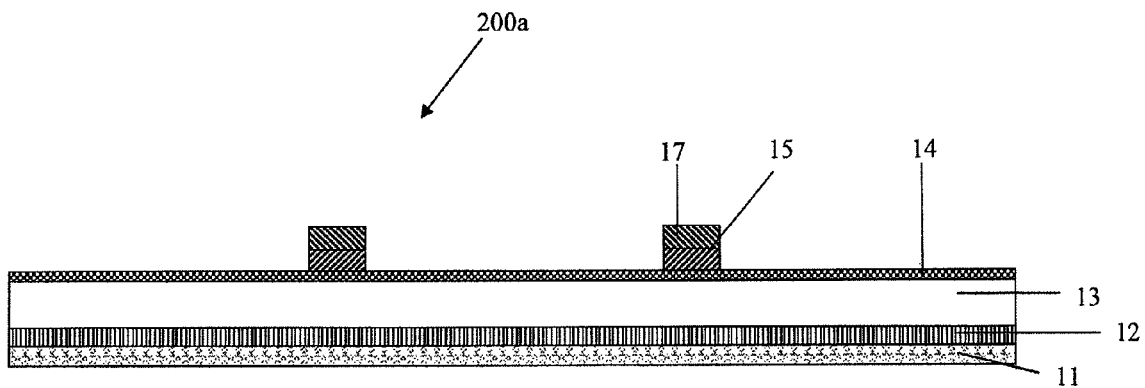
Figure 3D:
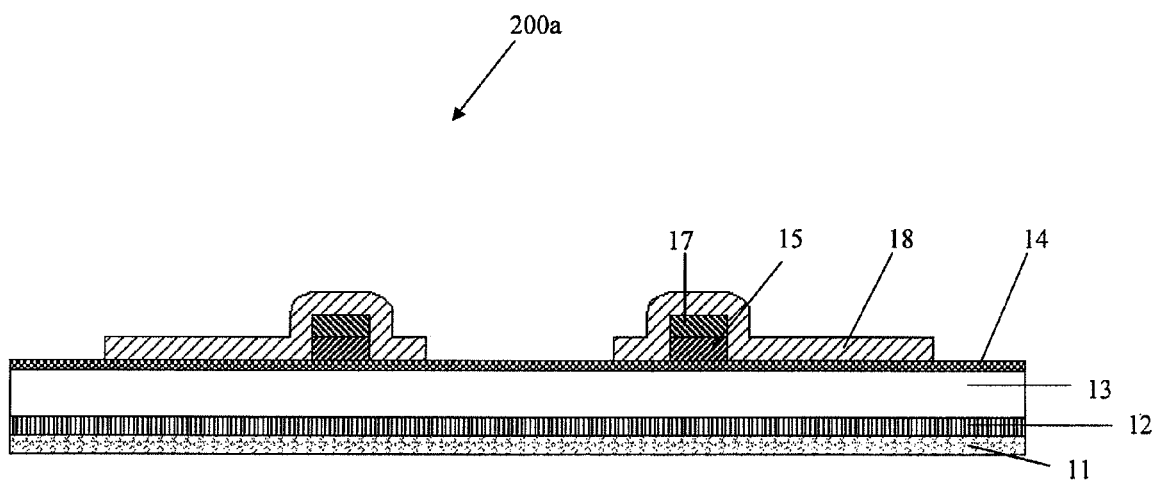

Referring now to FIG. 3D, a dielectric material 18, such as silicon nitride ($Si_3N_4$), is deposited. After deposition of the dielectric material 18, a contact photo mask is used to pattern and etch the dielectric material 18, followed by a photoresist strip, resulting in the structure shown in FIG. 3D.

Figure 3E:
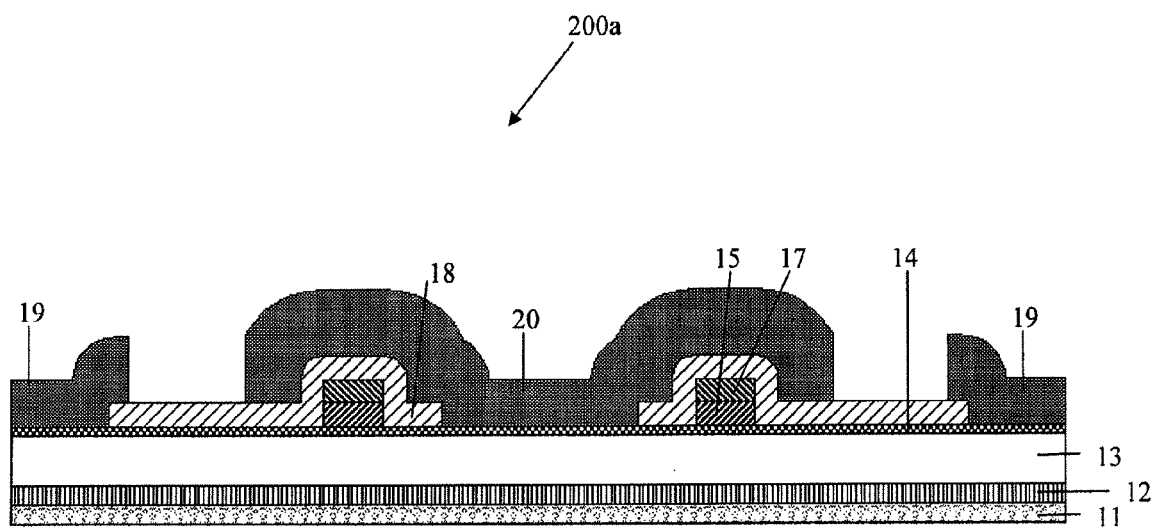

Referring now to FIG. 3E, ohmic contact metal is deposited. Ohmic contact metal can be made of titanium (Ti), aluminum (Al), and a capping metal stack. After ohmic metal deposition, a metal mask is used to pattern and etch the ohmic contact metal, resulting in the drain ohmic contact 19 and the source ohmic contact 20, as shown in FIG. 3E. Rapid thermal anneal (RTA) is performed to form ohmic contacts to AlGaN/GaN 2DEG. The source ohmic contact metal 20 is provided over the gate and acts as a field plate. It reduces the electric field at the corner of the p-type GaN material gate 15 closest to the drain ohmic contact 19.

In accordance with the above-described method, gate metal 17 and the p-type GaN material 15 are patterned and etched using a single photo mask and are thus automatically self-aligned. This reduces manufacturing cost. Minimum gate length can be the same as the photo/etch minimum CD, thereby minimizing gate charge. Cell pitch is reduced, thereby achieving lower $Rds_{ON}$. Because the source ohmic contact metal 20 is used as a field plate to relieve the electric field at the p-type GaN material gate corner closest to the drain ohmic contact 19, lower gate leakage current and improved gate reliability are achieved. In addition, the field plate at source potential shields the gate from the drain bias, such that gate-drain charge ($Q_{gd}$) is reduced.

Figure 4:
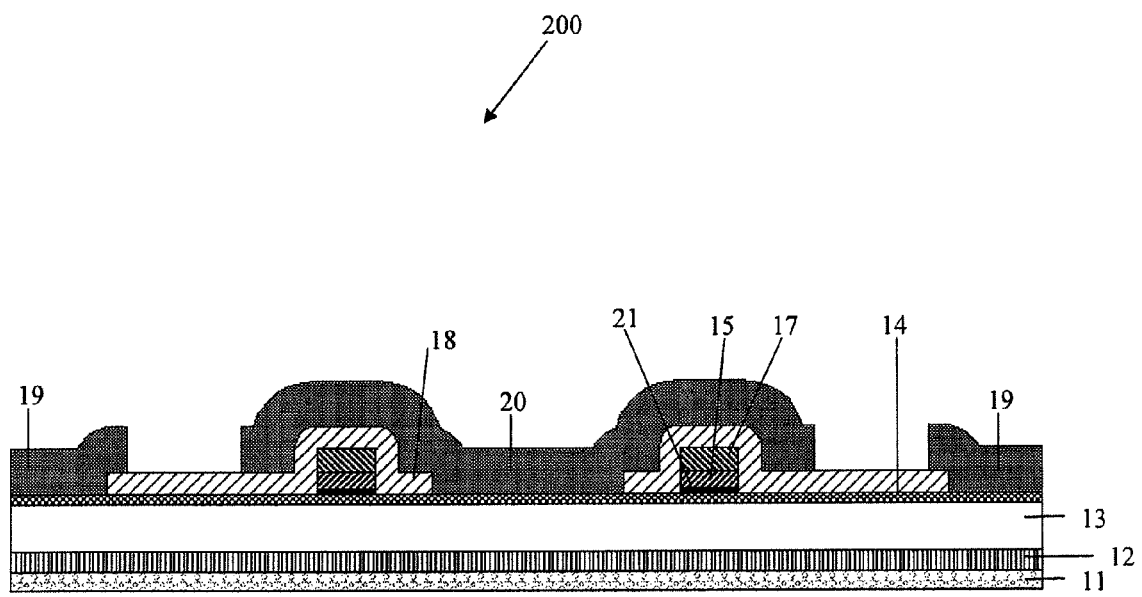
FIG. 4 illustrates an enhancement mode GaN HEMT device formed according to a second embodiment of the present invention.

Referring to FIGS. 4 and 5A-5E, a second embodiment of the invention is now described. FIG. 4 illustrates an enhancement mode GaN HEMT device 200 formed by the method shown in FIGS. 5A-5E, which results in a gate metal 17, a p-type GaN gate layer 15, and a p-type AlGaN material 21 that are self-aligned. Device 200 in FIG. 4 differs from device 200 of FIGS. 2 and 3A-3E in that it includes an additional layer, namely the layer formed of p-type AlGaN material 21.

Figure 5A:
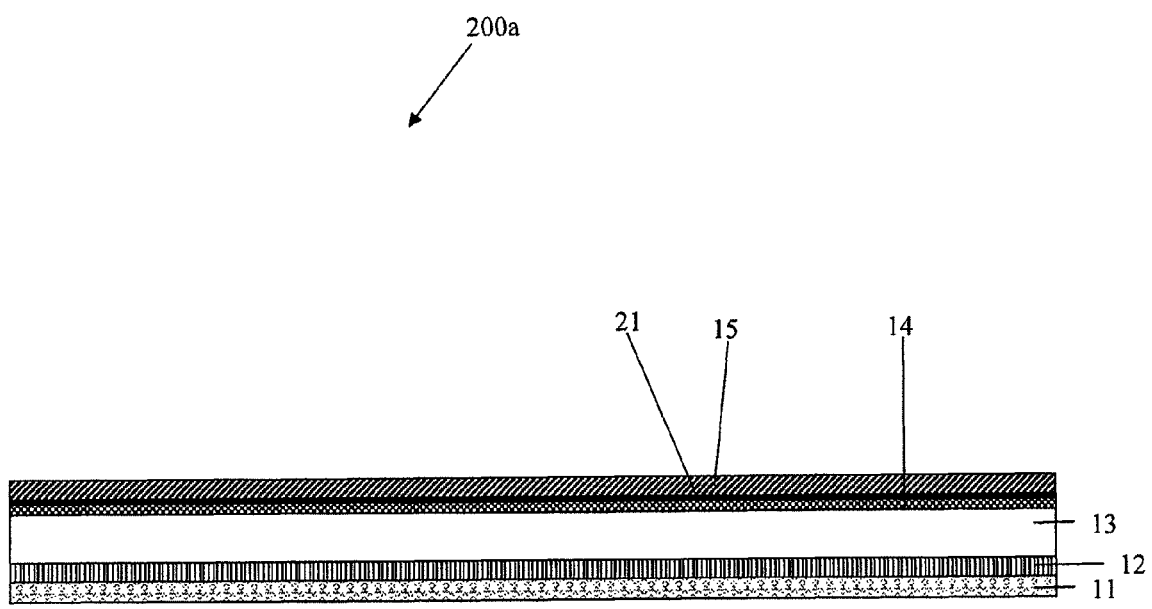
FIGS. 5A-5E schematically illustrate the formation of an enhancement mode GaN HEMT device according to the second embodiment of the present invention.

FIG. 5A illustrates the EPI structure, including, from bottom to top, silicon substrate 11, transition layers 12, un-doped GaN buffer material 13, un-doped AlGaN barrier material 14, p-type AlGaN material 21, and p-type GaN material 15. The dimensions and compositions of the various layers are similar to that of the first embodiment. The additional layer of p-type AlGaN material 21 preferably has a thickness of about 20 Å to about 300 Å, and includes Al from about 12 to about 100 percent of the AlGaN material.

Figure 5B:
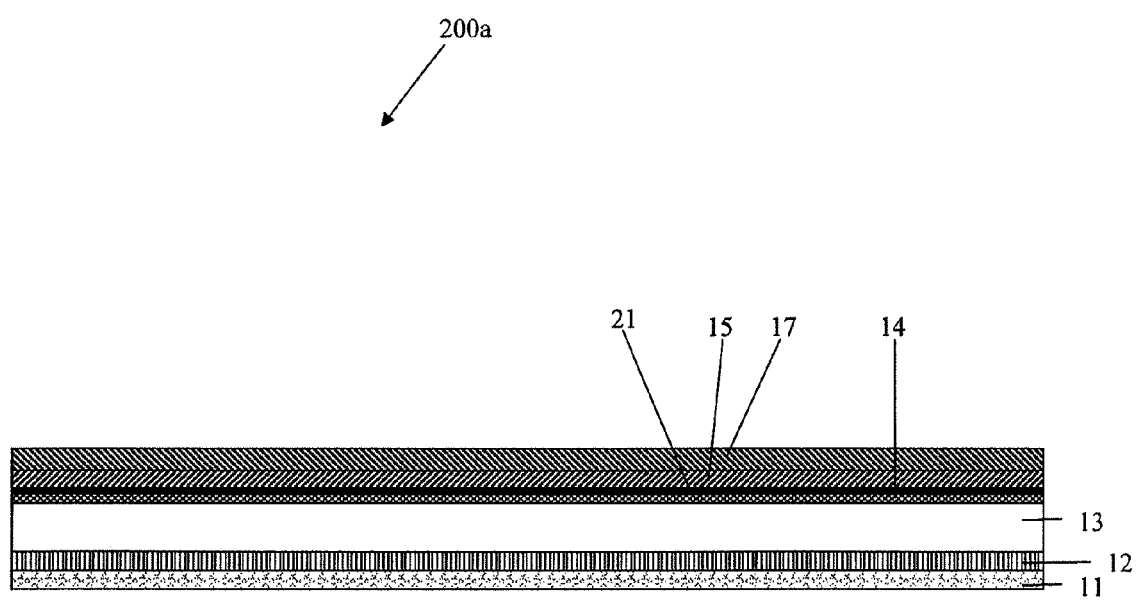

As shown in FIG. 5B, as in the first embodiment, a gate metal 17 is deposited or grown on the EPI structure shown in FIG. 5A.

Subsequently, a single photo mask is used to pattern and etch the gate metal 17, the p-type GaN material 15, and, in this case, also the p-type AlGaN material 21, resulting in the structure shown in FIG. 5C.

Figure 5C:
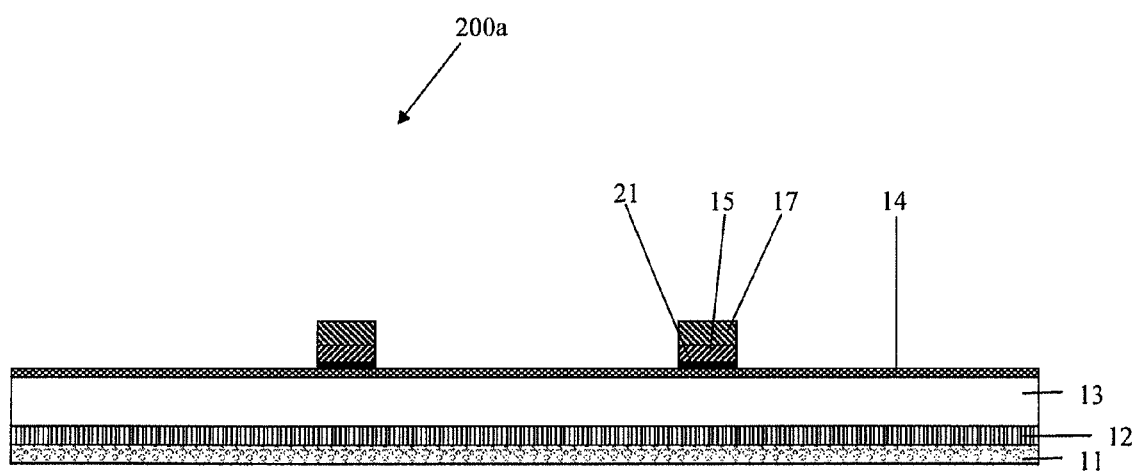
Figure 5D:
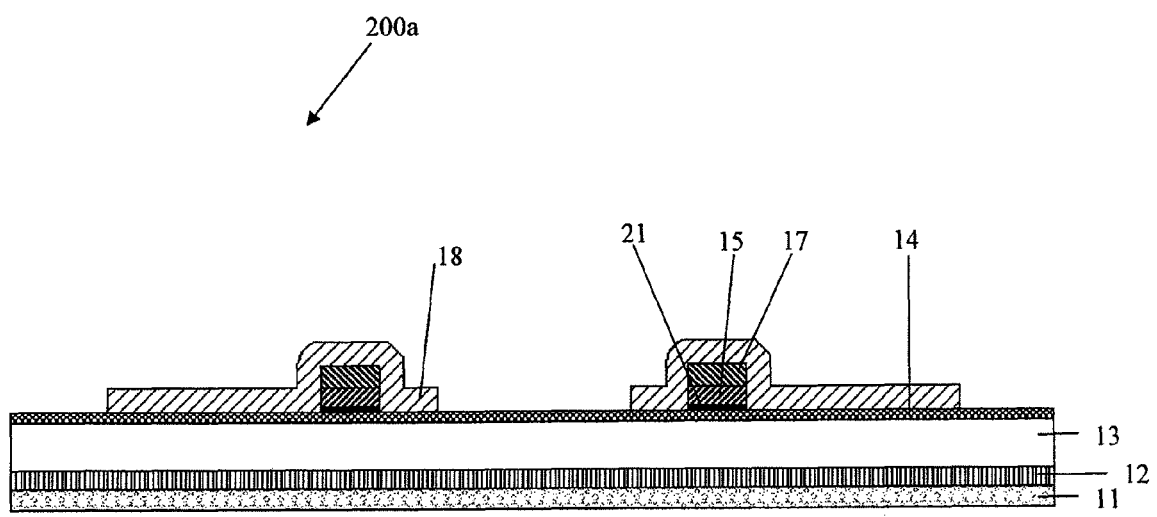

Referring to FIG. 5D, as before, a dielectric, silicon nitride ($Si_3N_4$), is deposited, and a contact photo mask is used to pattern and etch the dielectric material 18, followed by a photoresist strip, resulting in the structure shown in FIG. 5D.

Figure 5E:
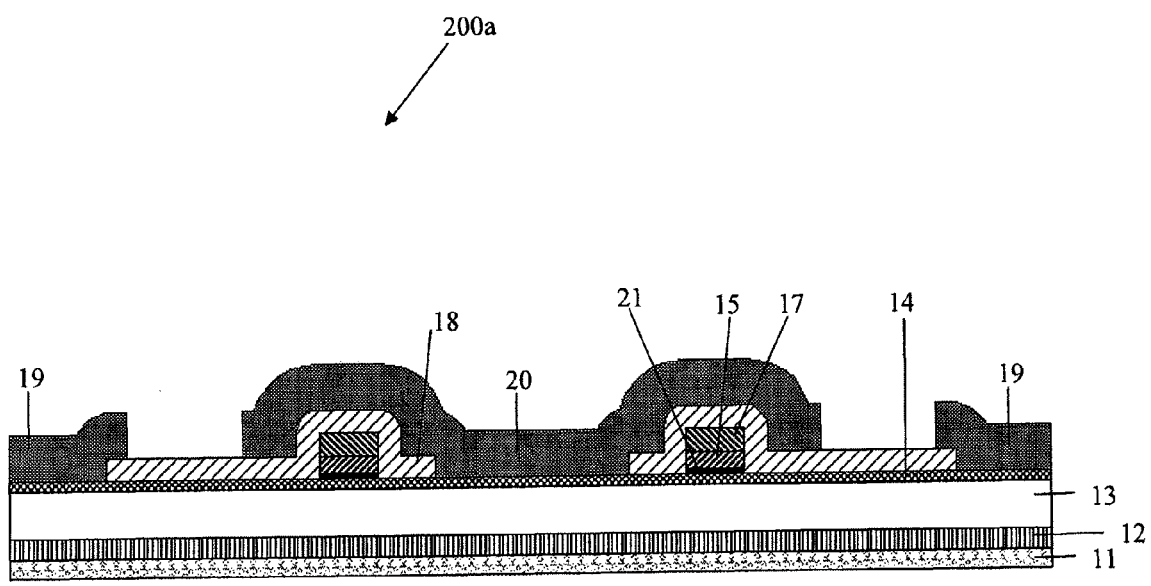
Figure 6:
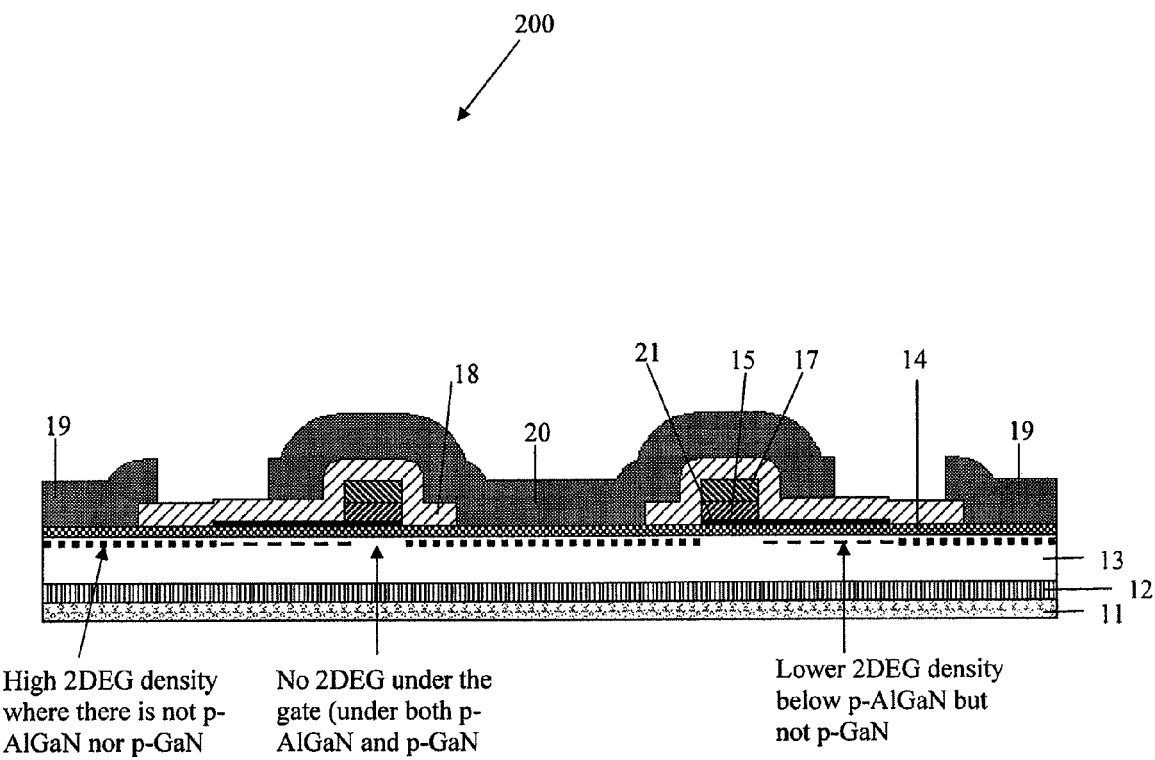
FIG. 6 illustrates an enhancement mode GaN HEMT device formed according to a third embodiment of the present invention.

In FIG. 5E, as before, an ohmic contact metal is deposited, and a metal mask is used to pattern and etch the ohmic contact metal, resulting in the drain ohmic contact 19 and the source ohmic contact 20, as shown in FIG. 5E. Rapid thermal anneal (RTA) is performed to form ohmic contacts to AlGaN/GaN 2DEG.

In accordance with the above-described method, gate metal 17, the p-type GaN material 15, and the p-type AlGaN material are patterned and etched using a single photo mask and are thus self-aligned, with the same advantages as the first embodiment.

Referring to FIGS. 6 and 7A-7F, a third embodiment of the present invention is now described. This embodiment of the invention is similar to the second embodiment described above, but in this embodiment the p-type AlGaN material 21 extends from the gate towards a drain ohmic contact 19. The presence of the p-type AlGaN material 21 extending from the gate towards the drain ohmic contact 19 forms a region with reduced 2DEG density. This further reduces the electric field at the gate corner and at the corner of the field plate, leading to higher breakdown voltage and reduced gate-drain charge ($Q_{gd}$).

Figure 7A:
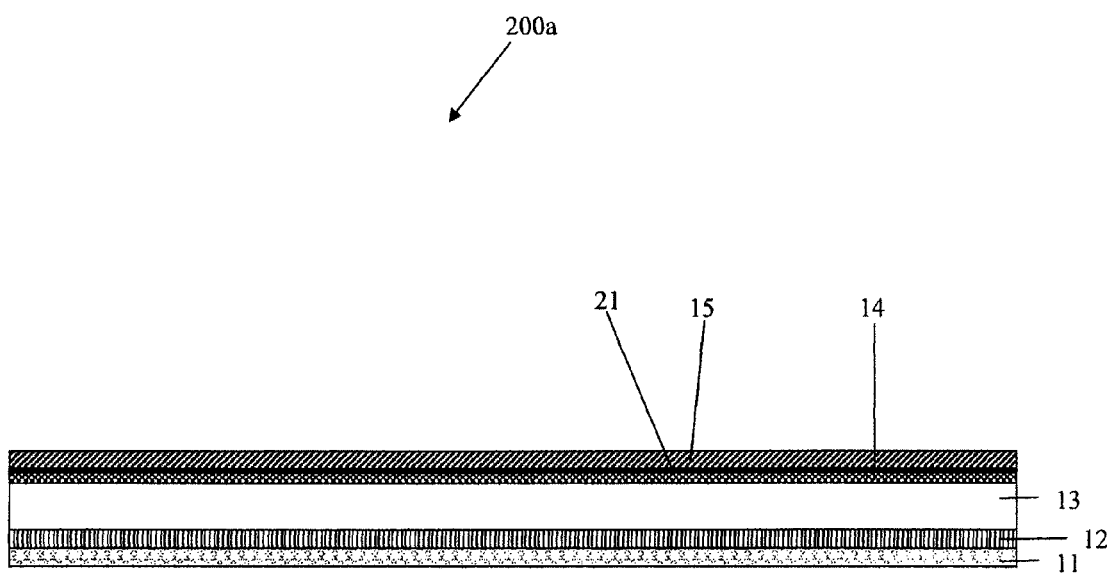
FIGS. 7A-7F schematically illustrate the formation of an enhancement mode GaN HEMT device according to the third embodiment of the present invention.
Figure 7B:
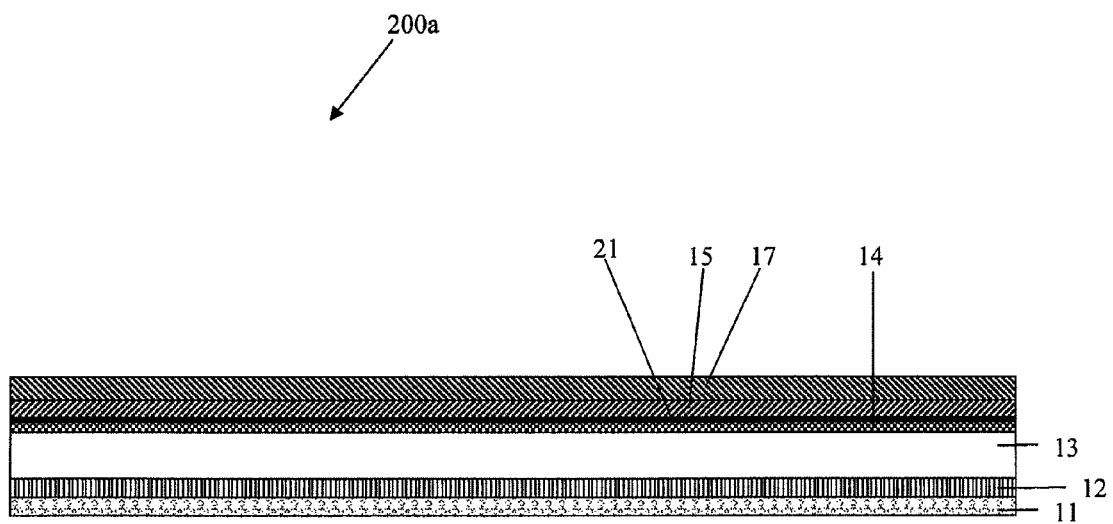
Figure 7C:
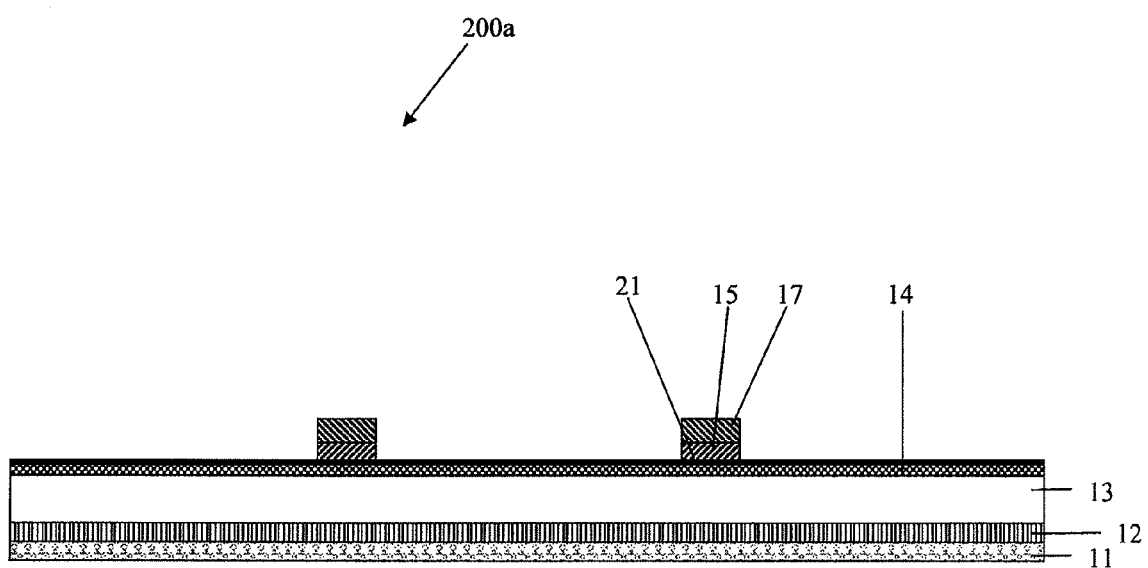
Figure 7D:
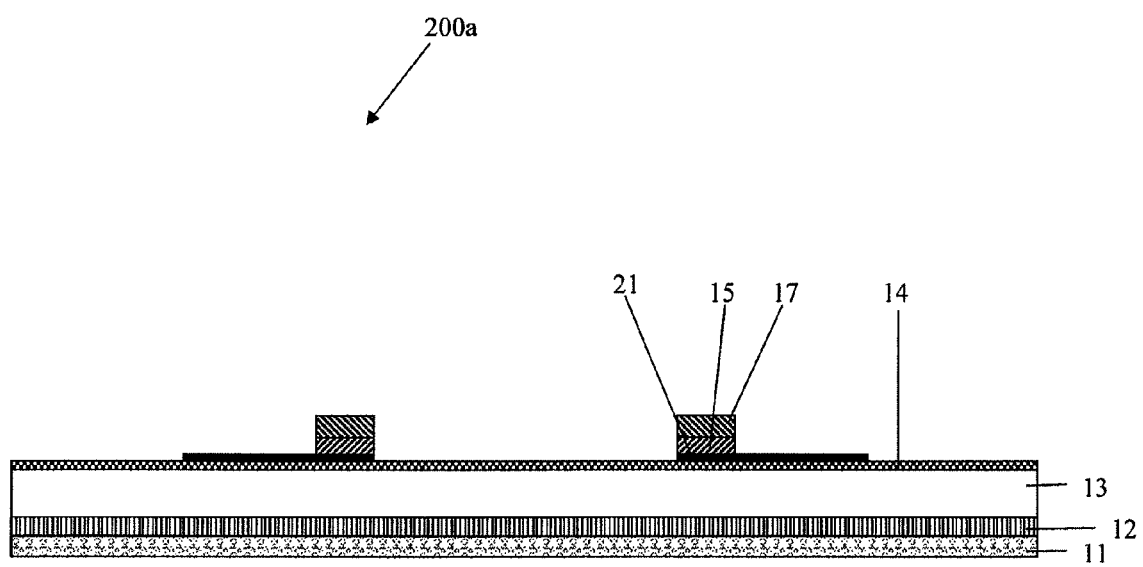

FIG. 7A-7C are similar to FIGS. 5A-5C described above. However, in 7C, a photo mask is used to pattern and etch only the gate metal 17 and the p-type GaN material 15 (and not the p-type AlGaN material 21), resulting in the self-aligned structure shown in FIG. 7C. Then, a photo mask is used to pattern and etch the p-type AlGaN material 21 in the pattern shown in FIG. 7D, such that the p-AlGaN material 21 extends outwardly from the gate (in the direction where the drain contacts will be formed).

Figure 7E:
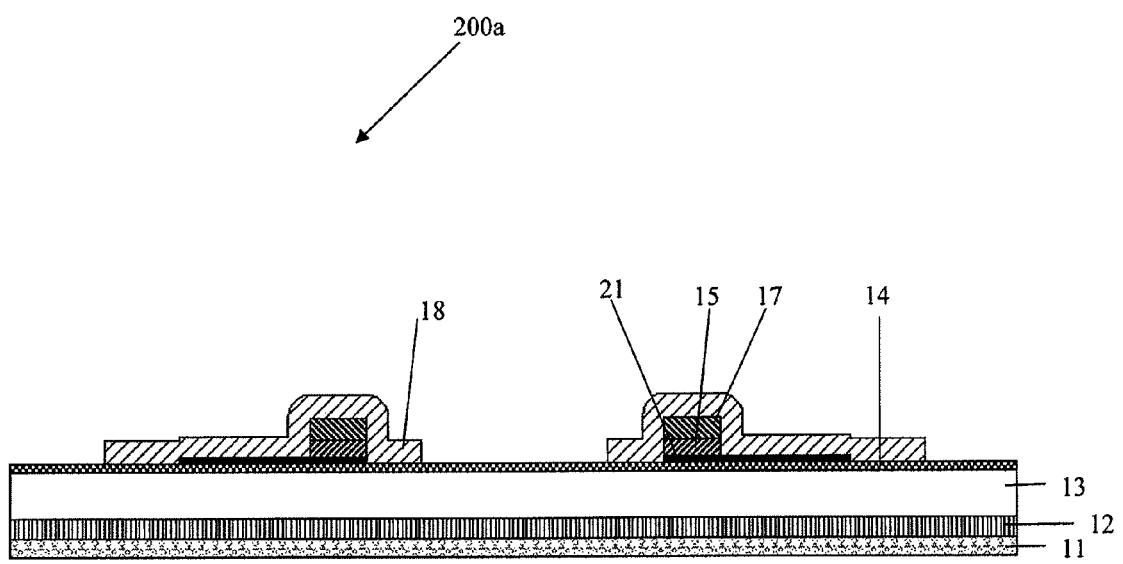
Figure 7F:
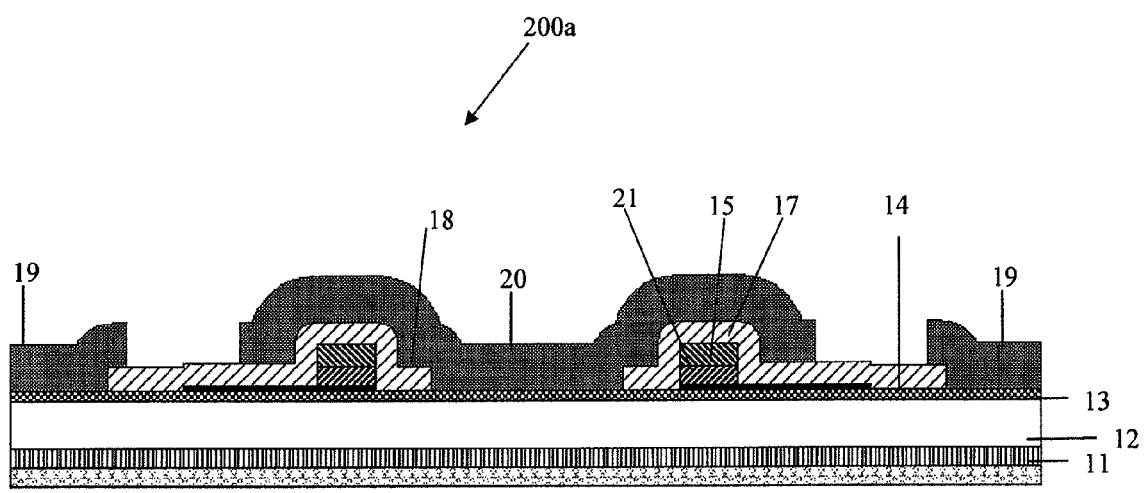

Referring now to FIG. 7E, the dielectric material 18, silicon nitride ($Si_3N_4$), is patterned and etched as before, and in FIG. 7F, the ohmic contact metal is formed as before.

In accordance with the above-described method, gate metal 17 and the p-type GaN material 15 are self-aligned. Additionally, the presence of the p-type AlGaN material extension from the gate towards drain contact in this embodiment further reduces the electric field at the gate corner and at the corner of the field plate, leading to higher breakdown voltage and reduced gate-drain charge ($Q_{gd}$).

Figure 8:
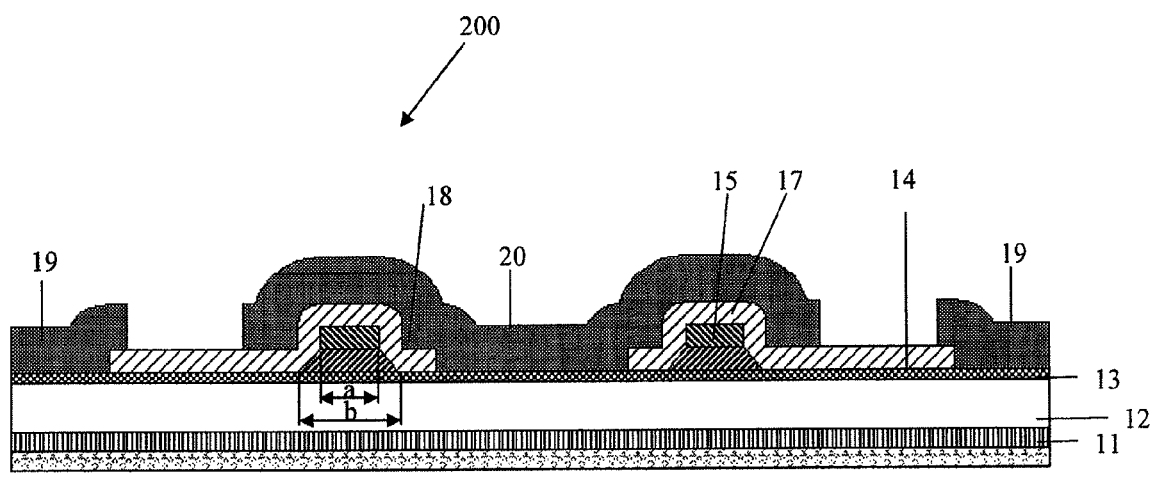
FIG. 8 illustrates an enhancement mode GaN HEMT device formed according to a fourth embodiment of the present invention.

Referring to FIG. 8, a fourth embodiment of the present invention is now described. This embodiment of the invention is similar to the first embodiment described above, except that the p-type GaN material 15 has been etched such that the bottom of the material is more than 10% wider than the top of the material, leading to sloped edges.

To achieve the sloped edges of p-type GaN material 15, the etching chemistry is modified. In a preferred embodiment, plasma etch is used and the power settings are modified to control the slope of the p-type GaN material. Thus, in accordance with the above-described method, the p-type GaN has a base that is more than 10% wider than the top. The wider base causes a longer path for electrons to travel between the gate metal 17 and the 2DEG along the pGaN side wall. This longer path results in lower gate leakage.

Figure 9:
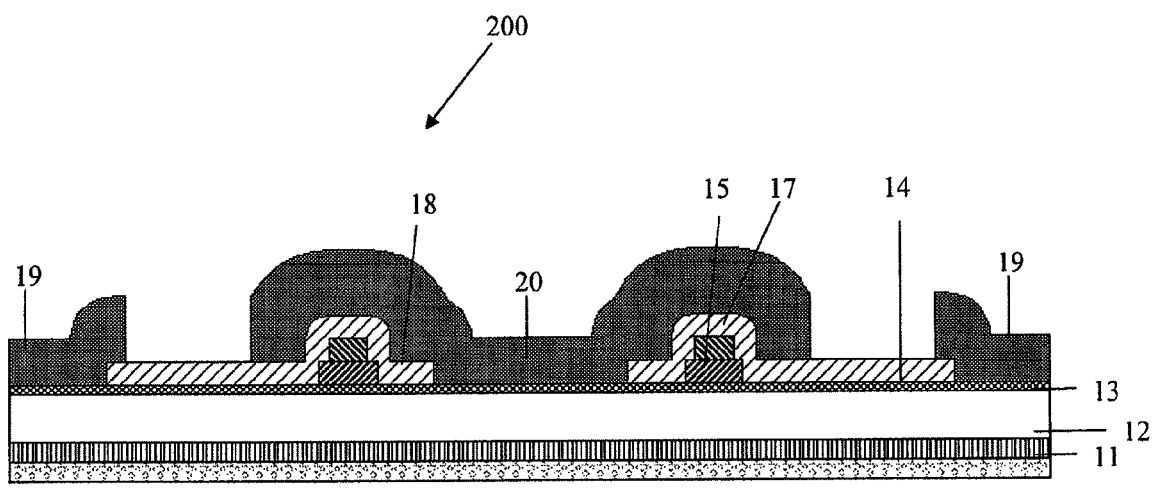
FIG. 9 illustrates an enhancement mode GaN HEMT device formed according to a fifth embodiment of the present invention.

Referring to FIG. 9, a fifth embodiment of the present invention is now described. This embodiment of the invention is similar to the first embodiment described above, except that the device as been etched to create a stepped gate.

The method of this embodiment follows the process in FIGS. 3A-3C. Following the step shown in FIG. 3C, the wafer is placed back in an etching machine that only etches the gate metal layer 17, without etching any other part of the device. The resulting structure, as shown in FIG. 9, has a stepped profile, which creates a longer resistance path for electrons to flow from the gate metal 17 to the 2DEG along the p-type GaN edge. This reduces the undesirable gate leakage current while maintaining all the desirable characteristics of a self-aligned structure.

Figure 10:
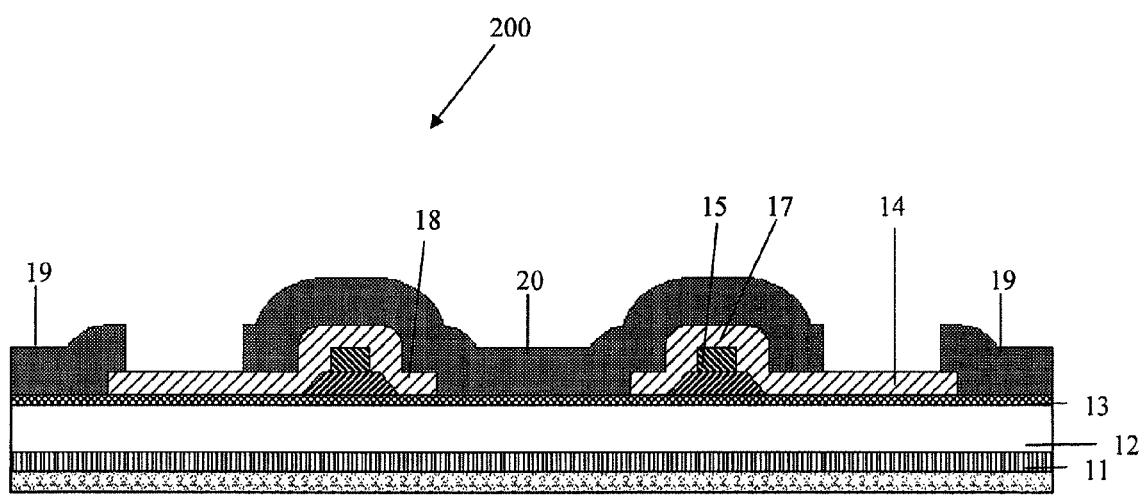
FIG. 10 illustrates an enhancement mode GaN HEMT device formed according to a sixth embodiment of the present invention.

Referring to FIG. 10, a sixth embodiment of the present invention is now described. This embodiment is essentially a combination of the fourth and fifth embodiments described above, and includes both a stepped gate profile and a p-type GaN material with sloped edges. The method used to create this structure is similar to that as described above with respect to the fourth and fifth embodiments. This embodiment increases the gate current path along the gate edges, thereby reducing gate leakage current.

Figure 11:
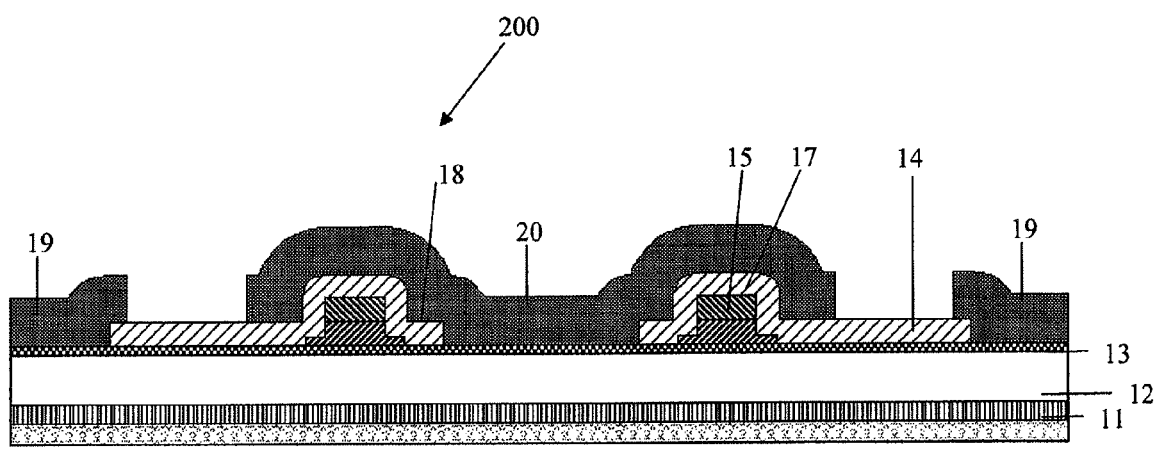
FIG. 11 illustrates an enhancement mode GaN HEMT device formed according to a seventh embodiment of the present invention.

Referring to FIG. 11, a seventh embodiment of the present invention is now described. This embodiment is similar to the first embodiment except that the p-type GaN material 15 has a symmetric ledge next to the AlGaN barrier. The method follows the process in FIGS. 3A-3B. Following the step shown in FIG. 3B, the self-aligned gate etch is conducted so that the etching conditions are changed during the etching process. One way of doing this is to change the temperature of the chuck upon which the wafer is placed during the etching process. A higher chuck temperature causes more polymers to be formed as a consequence of the plasma reacting with photoresist. These polymers effectively slow down the etch in close proximity to the sidewall of the gate metal thus creating a ledge. Low chuck temperatures do not produce a significant ledge, while higher temperatures produce a wide ledge. The seventh embodiment also has the benefit of the third embodiment. The p-type GaN ledge acts like the p-type AlGaN in the third embodiment to reduce 2DEG density, reduce the electric field at the gate corner, and improve device breakdown voltage.

Figure 12:
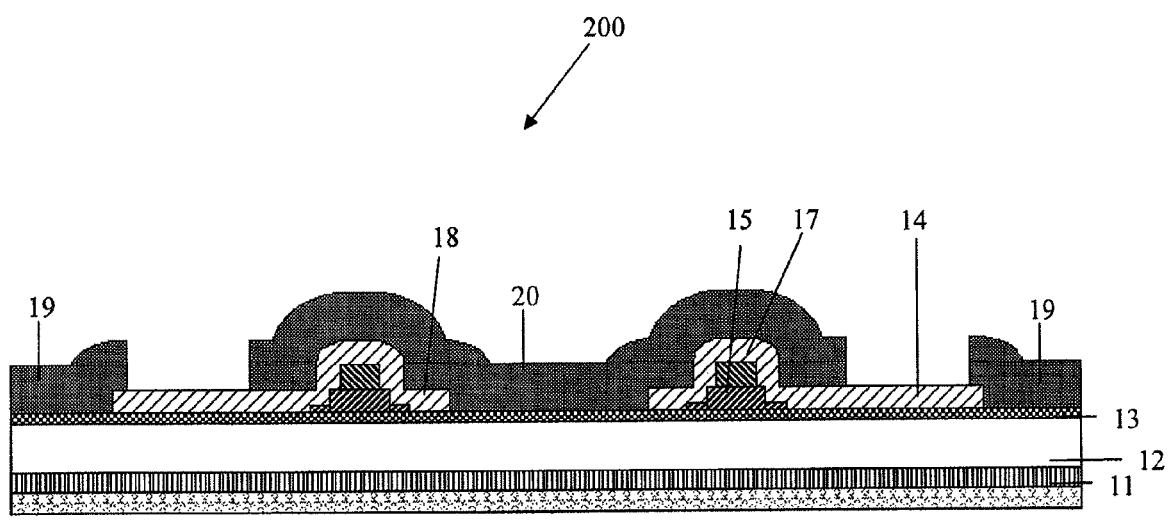
FIG. 12 illustrates an enhancement mode GaN HEMT device formed according to an eighth embodiment of the present invention.

Referring to FIG. 12, an eighth embodiment of the present invention is now described. This embodiment is essentially a combination of the fifth and seventh embodiments described above, and includes both a stepped gate profile and a symmetric ledge. The method used to create this structure is similar to that as described above with respect to the fifth and seventh embodiments. This embodiment has the advantage of both the fifth and seventh embodiments, thereby providing a structure that reduces gate leakage current.

In a ninth embodiment, the p-GaN material 15 is formed by introducing magnesium (Mg) impurities during the growth of the top EPI layer, for example, in FIG. 3A. Magnesium is the most common impurity atom used to create acceptor-rich (p-type) GaN.

In a tenth embodiment, magnesium impurities are compensated with hydrogen resulting in a semi-insulating p-type GaN layer instead of a conducting layer. There are several advantages to having a semi-insulating gate. One of the advantages is that the leakage current between the gate and source or drain is reduced. Another advantage is that the diode that is formed between the p-type GaN and the AlGaN has a lower forward drop than the diode formed between semi-insulating GaN and AlGaN. In devices of this embodiment, the diode forward drop is so high that it does not significantly conduct until the 2DEG is fully enhanced (between 1V and 5V).

In an eleventh embodiment, carbon impurities are introduced during the growth of the GaN gate layer 15 and no magnesium is used. Carbon impurities have a similar impact on the electrical characteristics of the GaN gate layer as magnesium compensated with hydrogen.

In a twelfth embodiment, magnesium impurities compensated with hydrogen are used with carbon impurities. This results in a semi-insulating GaN gate with improved electrical characteristics.

The above description and drawings are only to be considered illustrative of specific embodiments, which achieve the features and advantages described herein. Modifications and substitutions to specific process conditions can be made. Accordingly, the embodiments of the invention are not considered as being limited by the foregoing description and drawings.

The invention claimed is:
1. A method of forming an enhancement mode GaN transistor, the method comprising:
   nucleating and growing transition layers on a substrate;
   growing an III Nitride EPI layer over the transistor layers;
   growing an III Nitride barrier layer over the EPI layer;
   growing a GaN layer with acceptor type dopants over the barrier layer;
   depositing a gate contact layer on the doped GaN layer;
   applying a gate photo resistant pattern;

etching away the gate contact layer outside the gate region;
etching away the doped GaN layer, except a portion of the doped GaN layer beneath the gate contact;
removing the gate photo resistant pattern;
depositing a dielectric layer;
applying a contact photo resistant pattern;
etching the dielectric layer to open the drain and source contact area;
removing the contact photo resistant pattern;
depositing an Ohmic contact metal;
applying a metal photo resistant pattern;
etching the Ohmic contact metal;
removing the metal photo resistant pattern; and
performing rapid thermal annealing to form Ohmic drain and source contacts.

2. The method of claim 1, wherein the EPI layer is comprised of InAlGaN.

3. The method of claim 1, wherein the barrier layer is comprised of InAlGaN with a larger band gap than the buffer layer.

4. A method of forming an enhancement mode GaN transistor, the method comprising:
nucleating and growing transition layers on a substrate;
growing an InAlGaN EPI layer over the transistor layers;
growing an InAlGaN barrier layer over the InAlGaN EPI layer;
growing an InAlGaN layer with acceptor type dopants over the InAlGaN barrier layer;
growing a GaN layer with acceptor type dopants over the doped InAlGaN layer;
depositing a gate contact layer on the doped GaN layer
applying a gate photo resistant pattern;
etching away the gate contact layer outside the gate region;
etching away the doped GaN layer and the doped InAlGaN layer, except for portions of the doped GaN layer and the doped InAlGaN layer beneath gate contact;
removing the gate photo resistant pattern;
depositing a dielectric layer;
applying a contact photo resistant pattern;
etching the dielectric layer to open the drain and source contact area;
removing the contact photo resistant pattern;
depositing an Ohmic contact metal;
applying a metal photo resistant pattern;
etching the Ohmic contact metal;
removing the metal photo resistant pattern; and
performing rapid thermal annealing to form Ohmic drain and source contacts.

5. A method of forming an enhancement mode GaN transistor, the method comprising:
nucleating and growing transition layers on a substrate;
growing an InAlGaN EPI layer over the transistor layers;
growing an AlGaN barrier layer over the InAlGaN EPI layer;
growing an AlGaN layer with acceptor type dopants over the AlGaN barrier layer;
growing a GaN layer with acceptor type dopants over the doped AlGaN layer;
depositing a gate contact layer on the doped GaN layer
applying a gate photo resistant pattern;
etching away the gate contact layer outside the gate region;
etching away the doped GaN layer, except for portions of the doped GaN layer and the doped AlGaN layer beneath gate contact;
removing the gate photo resistant pattern;
applying another photo resistant pattern;
etching the doped AlGaN layer such that the doped AlGaN extends outside the gate region towards the drain;
removing the photo resistant pattern;
depositing a dielectric layer;
applying a contact photo resistant pattern;
etching the dielectric layer to open the drain and source contact area;
removing the contact photo resistant pattern;
depositing an Ohmic contact metal;
applying a fourth photo resistant pattern;
etching the Ohmic contact metal
removing the fourth photo resistant pattern; and
performing rapid thermal annealing to form Ohmic drain and source contacts.

* * * * *